United States Patent [19]

Frederiksen et al.

[11] 4,128,775
[45] Dec. 5, 1978

[54] VOLTAGE TRANSLATOR FOR INTERFACING TTL AND CMOS CIRCUITS

[75] Inventors: Thomas M. Frederiksen, San Jose; James B. Cecil, Santa Clara, both of Calif.

[73] Assignee: National Semiconductor Corporation, Santa Clara, Calif.

[21] Appl. No.: 808,752

[22] Filed: Jun. 22, 1977

[51] Int. Cl.² .................... H03K 17/60; H03K 1/02; H03K 1/14; H03K 19/08

[52] U.S. Cl. .................................. 307/264; 307/208; 307/251; 307/297; 307/315; 307/DIG. 1

[58] Field of Search ............... 307/203, 205, 207, 208, 307/213, 214, 215, 218, 264, 297, 304, 315, DIG. 1

[56] References Cited

U.S. PATENT DOCUMENTS

| | | | |
|---|---|---|---|
| 3,622,812 | 11/1971 | Crawford | 307/DIG. 1 X |
| 3,676,700 | 7/1972 | Buchanan | 307/DIG. 1 X |
| 3,755,690 | 8/1973 | Smith | 307/DIG. 1 X |
| 3,898,477 | 8/1975 | Buchanan | 307/DIG. 1 X |
| 3,900,746 | 8/1975 | Kraft et al. | 307/DIG. 1 X |
| 3,906,254 | 9/1975 | Lane et al. | 307/DIG. 1 X |
| 3,916,430 | 10/1975 | Heuner et al. | 307/DIG. 1 X |
| 4,023,050 | 5/1977 | Fox et al. | 307/DIG. 1 X |
| 4,031,409 | 6/1977 | Shimada et al. | 307/DIG. 1 X |
| 4,032,795 | 6/1977 | Hale | 307/DIG. 1 X |

OTHER PUBLICATIONS

Blaser et al., "Level Converting Circuit", *IBM Tech. Discl. Bull.;* vol. 18, No. 11, pp. 3722; 4/1976.
Askin et al., "Level Converting Circuit", *IBM Tech. Discl. Bull.;* vol. 18, No. 11, pp. 3723, 4/1976.
Freeman, "Level Shifting Circuit", *IBM Tech. Discl. Bull.;* vol. 18, No. 5, pp. 1450, 10/1975.

*Primary Examiner*—Larry N. Anagnos
*Attorney, Agent, or Firm*—Harry M. Weiss

[57] ABSTRACT

The invention described herein is an interface circuit which effectively allows TTL output voltages to fall within the range of CMOS input thresholds. The interface circuit contains bipolar and FET devices connected to generate an input voltage threshold which is equal to two base-emitter voltage drops. The interface circuit also includes a switching circuit portion which comprises one P-channel MOS transistor connected to one N-channel MOS transistor.

28 Claims, 1 Drawing Figure

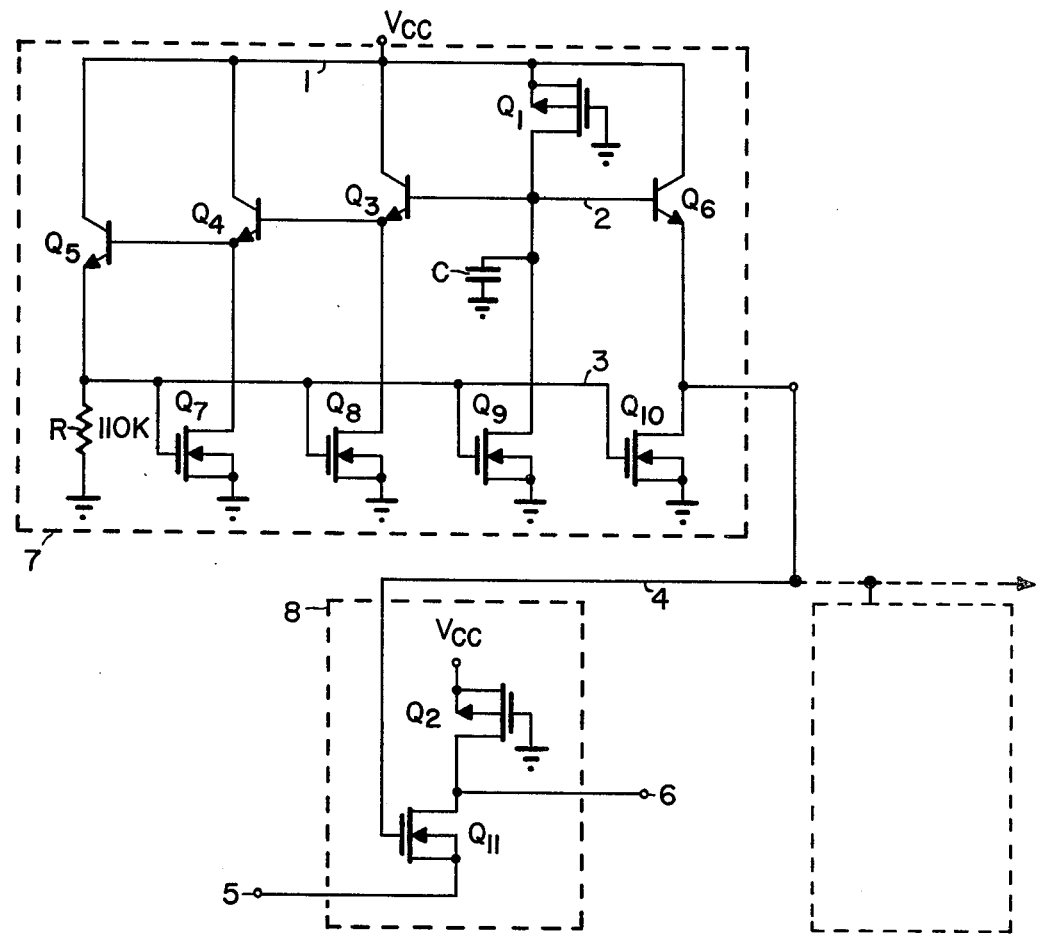

VOLTAGE TRANSLATOR FOR INTERFACING TTL AND CMOS CIRCUITS

BACKGROUND OF THE INVENTION

1. Field of the Invention

This invention relates generally to interface circuits and, more particularly, to interface circuits for use in interfacing TTL circuits to CMOS circuits.

2. Description of the Prior Art

Complementary MOS (known as CMOS) is a comparitively recent entry in the IC field and is a logical continuation of PNP/NPN bipolar complementary pair transistor applications utilizing P-channel/N-channel field effect transistor technology.

CMOS circuits are attractive to use for many applications because the power requirements to operate these circuits are very low.

TTL circuits usually operate with a $V_{CC}$ of 5 Volts or less and a V output (high) for a logical "one" generally ranges from 2.4 to 3.5 Volts. Complementary MOS circuits on the other hand will operate with a $V_{CC}$ of from 3 to 15 volts with the switching threshold, $V_T$, is approximately one-half of $V_{CC}$. It is possible to drive some CMOS circuits directly from TTL circuit outputs when the $V_{CC}$ to both circuits is 5 Volts, however, pull up resistors may be required, and temperature limitations may also arise. Some series of CMOS circuits cannot be directly driven by TTL's, even at a $V_{CC}$ of 5 Volts because the $V_{CC}$ for the CMOS circuits is higher than 5 Volts (i.e., the CMOS 4000 Series). For CMOS circuits which require $V_{CC}$'s of 10 and 15 Volts, it is not possible for TTL outputs to drive the CMOS input gates because in order to switch the CMOS input gate the required voltage of 2 $V_T$ for switching (7.5 Volts for a $V_{CC}$ of 10 Volts or about 10 Volts for a $V_{CC}$ of 15 Volts) is higher than the TTL V output (high).

In addition to the above suggested use of pull up resistors, which are generally used between $V_{CC}$ and the TTL output/CMOS input lead, CMOS designs for reduced logic thresholds have been used but these suffer from both initial voltage tolerance and improper changes with temperature.

Accordingly, a need existed to provide an interface circuit which could be incorporated in a CMOS chip for translating the logic outputs "1" or "0" from a TTL circuit into a "1" or "0" input acceptable to a CMOS circuit.

SUMMARY OF THE INVENTION

Accordingly, it is an object of this invention to provide an improved interface circuit for digital logic switching of CMOS gates from TTL outputs.

It is a further object of this invention to provide an improved interface circuit which uses bipolar devices fabricated during the process of making the CMOS devices and connected up with the CMOS devices to provide the interface circuit. It is also an object of this invention to provide an interface circuit that permits CMOS gate switching to follow TTL outputs.

DESCRIPTION OF THE PREFERRED EMBODIMENT

In accordance with an embodiment of this invention, an interface circuit is disclosed which is used for coupling an output from a bipolar (TTL) circuit to a MOS type circuit (CMOS) input. The interface circuit comprises a current regulation and bias voltage generating means for regulating current and generating a bias voltage source. The current regulation and bias voltage generating means comprising (a) bipolar transistor means for regulating current and providing a bias voltage output at a certain level and (b) MOS transistor means connected to the bipolar transistor means for providing a current sink for the bipolar transistor means. The interface circuit also comprises voltage translation means cooperatively connected to the bias voltage source of the current regulation and bias voltage generating means for translating any voltage input received from a bipolar (TTL) circuit to a voltage level that is suitable for driving a MOS type circuit (CMOS) and that corresponds to the voltage input signal received from the bipolar circuit input.

The interface circuit comprises four NPN bipolar transistors, two P-channel MOS transistors, five N-channel MOS transistors, one 110 Kilo-ohm resistor and a 5pf capacitor. The collectors of the four NPN transistors are connected to a $V_{CC}$ bus. Both P-channel MOS transistors are used as 50 micro-amp current sources. Three of the four NPN transistors are used in a triple Darlington emitter-follower configuration. The emitter of the third NPN transistor of the triple Darlington is grounded through the 110K ohm resistor. Each emitter of the other two NPN transistors of the triple Darlington is connected separately to a drain electrode or lead of one of two N-channel MOS transistors while the source electrode or leads of the two N-channel MOS transistors are grounded. The bases of two NPN transistors are connected together and to the $V_{CC}$ bus through one of the 50μa P-channel MOS transistor current sources. These bases are also connected to the drain electrode or lead of an N-channel MOS transistor and the source lead of this N-channel MOS transistor is connected to ground. The emitter of the fourth NPN transistor that is not Darlington connected is connected to the drain electrode or lead of another N-channel MOS transistor whose source is grounded. The gates of the four N-channel MOS transistors are connected to the ungrounded end of the 110K resistor.

Actual voltage translation is accomplished using the second P-channel 50μa current source MOS transistor and a connected N-channel MOS transistor. The source of the P-channel MOS current source transistor is connected to the $V_{CC}$ bus and the drain is connected to the drain of the connected N-channel MOS transistor whose source is the input lead of the CMOS chip and will be connected to the TTL output. The gate of the fifth N-channel MOS transistor is connected to the conductor that connects the NPN transistor emitter that is not Darlington connected. This connection provides a closely regulated 2.4 Volt source which serves as a gate bus for the fifth N-channel MOS transistor and can be used to similarly bias other gates of voltage translator pairs. The CMOS switching input comes from the drain/drain connection of the complementary pair comprising the P-channel 50μa current source MOS transistor and the connected N-channel MOS transistor whose source is connected to a TTL output.

The foregoing, and other objects, features, and advantages of the invention will be apparent from the following, more particular description of the preferred embodiments of the invention, as illustrated in the accompanying drawing.

BRIEF DESCRIPTION OF THE DRAWING

The sole FIGURE is an electrical schematic of the interface circuit of this invention.

Referring to the sole FIGURE, $V_{CC}$ bus (preferably connected to a power supply that provides from 5 to 15 Volts and usually 15 Volts) is connected to the collectors of NPN transistors Q3, Q4, Q5 and Q6. The base electrodes or leads Q3 and Q6 are connected together by conductor 2 which is also connected to the drain lead of P-channel MOS transistor Q1. The source lead of MOS transistor Q1 is connected to the $V_{CC}$ bus 1. Both Q1 and Q2 (which is one of the voltage translator pairs located at the bottom of the sole FIGURE) are matched P-channel MOS transistors which function as 50μa current sources. MOS transistor Q1 forward biases NPN transistors Q3 and Q6 and contributes to the drain current of MOS N-channel transistor Q9 which functions as a current sink.

NPN transistors Q3, Q4 and Q5 are connected together in a common collector, triple Darlington arrangement with the emitters of Q3 and Q4 connected to ground through N-channel MOS transistors Q8 and Q7, respectively, which also function like Q9 as current sink devices. The emitter of NPN transistor Q5 is connected to ground through a preferably 110K ohm resistor R. The non-grounded end of the 110K ohm resistor R is connected by a common lead or conductor 3 to the gate electrodes or leads of the N-channel MOS transistors Q7, Q8, Q9 and N-channel MOS transistor Q10 whose source electrodes or leads are all connected to ground.

Thus, the 110K resistor R connection to the gate electrodes of N-channel MOS transistors Q7, Q8, Q9 and Q10 provides a common bias using the lead 3. The voltage on the bias lead 3 is the drop across the 110K resistor R caused by current flowing through the collector and emitter of NPN transistor Q5 from $V_{CC}$ to ground. The voltage threshold on the gates of N-channel MOS devices Q7, Q8, Q9 and Q10 ($V_{THN}$) on the bias lead 3 due to the voltage drop across the 110K ohm resistor R forward biases the N-channel MOS transistors Q7, Q8, Q9 and Q10. The drain current through Q7 is from $V_{CC}$ through Q4. The drain current through Q8 is from $V_{CC}$ through Q3. The drain current through Q9 is from the 50μa current source P-channel transistor Q1 whose drain is also connected to the bases of Q3 and Q6 via the conductor 2. A 5pf stabilizing capacitor C is connected between ground and common point formed by connection from the bases of Q3 and Q6 and the drain electrodes or leads of Q1 and Q9.

The voltage $V_{THN}$ on the gate of Q9 from the common bias lead 3 maintains a drain current through Q9 (which functions as a current sink) of most of the 50μa current from the current source Q1. The bias lead 3 which is also connected to the gate of the N channel transistor Q10 forward bias Q10 to accommodate current from $V_{CC}$ through transistor Q6 thereby acting as a current bias for NPN transistor Q6. A gate bias bus or conductor 4 is connected to the lead from the emitter of the NPN transistor Q6 which is connected to the drain lead of the N-channel MOS transistor Q10.

OPERATION OF THE CIRCUIT

It is the function of the current regulator (triple Darlington) including Q3, Q4 and Q5 to drive the gate bias conductor 3 to generate a voltage level thereon which allows Q9 to carry 50 μa ($V_{THN}$ at 50 μa) which is approximately 1 Volt. The voltage level on the conductor 4, however, is equal to the sum of two base-emitter junctions (2 $V_{BE}$) where $V_{BE}$ is approximately 0.7 volts plus the gate bias $V_{THN}$ on the bias lead 3 which is approximately 1 Volt. Thus, the voltage value which is maintained on the gate bias bus or conductor 4, for all appropriate values of $V_{CC}$ is approximately 2.4 Volts. The current regulator/gate bias generator as described above shown within dotted box 7 can be used as a separate circuit or incorporated as part of a CMOS integrated circuit. The three terminals to this part of the circuit (shown in box 7) would be $V_{CC}$, ground and the gate bias conductor 4.

While only one voltage translator circuit portion is shown in dotted box 8, additional voltage transistor circuit portions can be added to switch as many CMOS gate inputs as required. Each voltage translator circuit would require four terminals, $V_{CC}$, ground, terminal 5 to a TTL output, and terminal 6 to a CMOS input gate.

The voltage translator (box 8) includes the 50μa current source P-channel MOS transistor Q2 with its gate grounded and one N-channel MOS transistor Q11 with its gate connected to the gate bias bus or conductor 4. This causes the $V_{TH}$ of Q11 to be equal to that of the reference N-channel MOS, Q9. This causes the $V_{THN}$ term to cancel out and makes the switching point at the input point, node 5, to be 2$V_{BE}$ which is exactly the TTL logic threshold and has the same temperature dependence. The source lead of Q2 is connected to $V_{CC}$ and its drain lead is connected to the drain of Q11. The source lead of Q11 is connected to terminal 5 which serves as the input from a TTL output terminal. The common drain line between Q2 and Q11 is connected to terminal 6 which serves as the CMOS gate input lead.

LOGIC "0" OPERATION

As already mentioned, Q2 is matched to Q1 and both are used as a 50μa current source. The gate of the N-channel transistor Q11 is maintained at 2 $V_{BE}$ + $V_{THN}$ or approximately 2.4 Volts. When the terminal 5 is at an output low ($V_{OL}$) from the TTL output (logical "0" = 0.2 to 0.4 volts), Q11 conducts because of an effective gate voltage of 2 to 2.2 volts. Thus, when Q11 is turned on or conducting, it functions as a current sink for pulling substantially all of the current from Q2. The voltage at terminal 6, which is the CMOS input, is now equal to the drain/source drop across Q11, or the low voltage state ("0" level) for the on-chip CMOS logic.

LOGIC "1" OPERATION

When the TTL output is high for a logical "1" ($V_{OH}$), the $V_{OH}$ applied to the terminal 5 is a minimum of 2.4 to 3.4 volts. The effective voltage from gate source of Q11 in this condition is now from zero to minus one volt. This cuts off Q11 and therefore the voltage at the terminal 6 which is the CMOS gate input, rises to very nearly $V_{CC}$, thus furnishing a reliable switching margin, well above the CMOS switching threshold.

While the invention has been particularly shown and described with reference to a preferred embodiment thereof, it will be understood by those skilled in the art that other changes in form and detail and omissions may be made therein without departing from the spirit and scope of the invention.

What is claimed is:

1. An interface circuit especially useful for coupling a TTL circuit output to a CMOS circuit input comprising, in combination, current regulation and bias voltage generating means for regulating current and generating a bias voltage source, voltage translation means cooperatively connected to said bias voltage source of said current regulation and bias voltage generating means for translating any voltage input received from a TTL circuit output to a voltage level that is suitable for driving a CMOS circuit and that corresponds to the voltage input signal received from the TTL circuit output, and said current regulation and bias voltage generating means comprising bipolar transistor means having a plurality of transistors electrically connected together at each base thereof for regulating current and providing a bias voltage output at a certain level, and MOS transistor means having a plurality of MOS transistors each of which is connected to an electrode of one of said plurality of transistors of said bipolar transistor means for providing a current sink for said bipolar transistor means.

2. An interface circuit in accordance with claim 1 wherein said bipolar transistor means comprising a plurality of NPN transistor devices, each of said plurality of MOS transistors of said MOS transistor mean being electrically connected to an emitter of a different one of the emitters of said bipolar transistors of said bipolar transistor means.

3. An interface circuit in accordance with claim 2 wherein said plurality of NPN transistor devices comprising four NPN transistor devices, three of said four NPN transistor devices being connected as a common collector, triple Darlington, the base of one of said triple Darlington NPN transistor devices being connected to the base of the fourth NPN transistor device.

4. An interface circuit in accordance with claim 3 wherein the collectors of said four NPN transistor devices being connected to a voltage source $V_{CC}$.

5. An interface circuit in accordance with claim 1 wherein said MOS transistor means comprising a plurality of N channel MOS transistor devices.

6. An interface circuit in accordance with claim 5 including a resistor connected to the gate electrodes of each of said plurality of N channel MOS transistor devices.

7. An interface circuit in accordance with claim 6 including current source P channel MOS transistor device and a capacitor connected to the drain electrode of said current source P channel MOS device.

8. An interface circuit in accordance with claim 5 wherein said plurality of N channel MOS transistor devices comprising four N channel MOS transistor devices.

9. An interface circuit in accordance with claim 5 including a current source P channel MOS transistor device, said current source P channel MOS transistor device being connected to one of said plurality of N channel MOS transistor devices.

10. An interface circuit in accordance with claim 9 wherein the drain of said current source P channel MOS transistor device is connected to the drain of said one of said plurality of N channel MOS transistor devices, the source of said current source P channel MOS transistor device is connected to a voltage source ($V_{CC}$).

11. An interface circuit in accordance with claim 5 wherein said bipolar transistor means comprising a plurality of NPN transistor devices.

12. An interface circuit in accordance with claim 11 wherein said plurality of NPN transistor devices comprising four NPN transistor devices, three of said four NPN transistor devices being connected as a common collector, triple Darlington, the base of one of said triple Darlington NPN transistor devices being connected to the base of the fourth NPN transistor device.

13. An interface circuit in accordance with claim 12 wherein the collectors of said four NPN transistor devices being connected to said voltage source $V_{CC}$.

14. An interface circuit in accordance with claim 13 including a resistor connected to the gate electrodes of each of said plurality of N channel MOS transistor devices.

15. An interface circuit in accordance with claim 14 including a current source P channel MOS transistor device and a capacitor connected to the drain electrode of said current source P channel MOS device.

16. An interface circuit in accordance with claim 14 wherein said resistor being connected to the emitter of one of said plurality of NPN transistor devices.

17. An interface circuit in accordance with claim 16 wherein said resistor being connected between ground and an emitter of one of said triple Darlington connected NPN transistor devices.

18. An interface circuit in accordance with claim 17 including a current source P channel MOS transistor device connected to one of said plurality of N channel MOS transistor devices, said current source P channel MOS transistor device having a gate electrode connected to ground, the source of said current source P channel MOS transistor device is connected to a voltage source ($V_{CC}$).

19. An interface circuit in accordance with claim 11 wherein each emitter of each of said plurality of NPN transistor devices being connected to a drain electrode of one of said plurality of N channel MOS transistor devices.

20. An interface circuit in accordance with claim 19 wherein each of the source electrodes of each of said plurality of N channel MOS transistor devices being connected to ground.

21. An interface circuit especially useful for coupling a TTL circuit output to a CMOS circuit input comprising, in combination, current regulation and bias voltage generating means for regulating current and generating a bias voltage source, voltage translation means cooperatively connected to said bias voltage source of said current regulation and bias voltage generating means for translating any voltage input received from a TTL circuit output to a voltage level that is suitable for driving a CMOS circuit and that corresponds to the voltage input signal received from the TTL circuit output, and said voltage translation means comprising a complementary pair of MOS transistor devices, the gate of one of said complementary pair of MOS transistor devices being electrically connected to the output of said current regulation and bias voltage generating means, one of the electrodes of one of said complementary pair of MOS transistor devices being electrically connected to a corresponding electrode of the other of said complementary pair of MOS transistor devices.

22. An interface circuit in accordance with claim 21 wherein one of said complementary pair of MOS transistor devices comprising a current source P channel MOS transistor device, the other of said complementary pair of MOS transistor devices comprising an N channel MOS switching transistor device connected in series to said current source P channel MOS transistor device.

23. An interface circuit in accordance with claim 22 wherein the drain of said current source P channel MOS transistor device being connected to the drain of said N channel MOS switching transistor device.

24. An interface circuit in accordance with claim 23 wherein the gate of said current source P channel MOS transistor device being connected to ground, the source of said current source P channel MOS transistor device being connected to a voltage source ($V_{CC}$).

25. An interface circuit in accordance with claim 24 wherein said source of said N channel MOS switching transistor being connected to a TTL output terminal, said drain of said N channel MOS switching transistor also being connected to a CMOS input terminal, the gate of said N channel MOS switching transistor being connected to said bias voltage source of said current regulating and bias voltage generating means, said bias source being approximately 2.4 Volts.

26. An interface circuit in accordance with claim 22 wherein said current regulation and bias voltage generating means comprising bipolar transistor means having a plurality of transistors electrically connected together at each base thereof for regulating current and providing a bias voltage output at a certain level, and MOS transistor means having a plurality of MOS transistors each of which is connected to an electrode of one of said plurality of transistors of said bipolar transistor means for providing a current sink for said bipolar transistor means, said MOS transistor means comprising a plurality of N channel MOS transistor devices.

27. An interface circuit in accordance with claim 21 wherein said current regulation and bias voltage generating means comprising bipolar transistor means having a plurality of transistors electrically connected together at each base thereof for regulating current and providing a bias voltage output at a certain level, and MOS transistor means having a plurality of MOS transistors each of which is connected to an electrode of one of said plurality of transistors of said bipolar transistor means for providing a current sink for said bipolar transistor means.

28. An interface circuit in accordance with claim 27 wherein said bipolar transistor means comprising a plurality of NPN transistor devices, said plurality of NPN transistor devices comprising four NPN transistor devices, three of said four NPN transistor devices being connected as a common collector, triple Darlington, the base of one of said triple Darlington NPN transistor devices being connected to the base of the fourth NPN transistor devices, and the collectors of said four NPN transistor devices being connected to a voltage source $V_{CC}$.

* * * * *